(12) United States Patent
Huang

(10) Patent No.: US 9,897,632 B2
(45) Date of Patent: Feb. 20, 2018

(54) MONITOR CIRCUIT

(71) Applicant: MediaTek Inc., Hsin-Chu (TW)

(72) Inventor: Bo-Jr Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 66 days.

(21) Appl. No.: 15/014,664

(22) Filed: Feb. 3, 2016

(65) Prior Publication Data

US 2016/0320446 A1 Nov. 3, 2016

Related U.S. Application Data

(60) Provisional application No. 62/154,366, filed on Apr. 29, 2015.

(51) Int. Cl.
G01R 11/32 (2006.01)
G01R 31/08 (2006.01)
G01R 19/00 (2006.01)
G01R 21/00 (2006.01)
G06F 1/28 (2006.01)
G01R 19/252 (2006.01)
G01R 1/20 (2006.01)
G01R 19/25 (2006.01)

(52) U.S. Cl.
CPC ......... *G01R 19/0092* (2013.01); *G01R 21/00* (2013.01); *G06F 1/28* (2013.01); *G01R 1/203* (2013.01); *G01R 19/252* (2013.01); *G01R 19/2503* (2013.01)

(58) Field of Classification Search
CPC .............................. G01R 19/0092; G01R 21/00
USPC .................................................. 324/522, 142
See application file for complete search history.

(56) References Cited

U.S. PATENT DOCUMENTS

| | | | | |
|---|---|---|---|---|
| 6,011,413 A | * | 1/2000 | Hayakawa | ......... G01R 19/0092 327/51 |
| 2010/0007327 A1 | * | 1/2010 | Andoh | ............. G01R 31/31924 324/76.11 |
| 2012/0323436 A1 | * | 12/2012 | Grieser-Schmitz | ..... B60T 13/66 701/34.4 |

* cited by examiner

*Primary Examiner* — Amy He
(74) *Attorney, Agent, or Firm* — McClure, Qualey & Rodack, LLP

(57) ABSTRACT

A monitor circuit for monitoring a CUT (Circuit Under Test) is provided. The monitor circuit includes a power switch and a current meter. The power switch is coupled between a supply voltage and the CUT. The current meter is coupled in parallel with the power switch. The current meter is configured to detect a current through the CUT.

8 Claims, 6 Drawing Sheets

MONITOR CIRCUIT

CROSS REFERENCE TO RELATED APPLICATIONS

This application claims the benefit of U.S. Provisional Application No. 62/154,366, filed on Apr. 29, 2015, the entirety of which is incorporated by reference herein.

BACKGROUND OF THE INVENTION

Field of the Invention

The disclosure generally relates to a monitor circuit, and more specifically, to a monitor circuit for monitoring the power consumption of a CUT (Circuit Under Test).

Description of the Related Art

In order to prevent problems related to the overheating of a chip, monitoring power consumption is an indispensable process in the design of semiconductors. However, an integrated circuit generally includes many SOCs (Systems On the Chip). Since these SOCs often belong to the same power domain (i.e., they are all supplied by the same supply voltage), it is difficult to determine which SOC in the chip consumes the most power. Accordingly, there is a need to design a novel monitor circuit for addressing the drawbacks of conventional monitor circuits and processes.

BRIEF SUMMARY OF THE INVENTION

In a preferred embodiment, the disclosure is directed to a monitor circuit for monitoring a CUT (Circuit Under Test). The monitor circuit includes a power switch and a current meter. The power switch is coupled between a supply voltage and the CUT. The current meter is coupled in parallel with the power switch. The current meter is configured to detect a current through the CUT.

In some embodiments, the power switch has a first terminal coupled to the supply voltage, and a second terminal coupled to the CUT. The current meter has a first terminal coupled to the first terminal of the power switch, and a second terminal coupled to the second terminal of the power switch.

In some embodiments, the current meter includes a voltmeter and a divider.

In some embodiments, the voltmeter detects a voltage difference between the first terminal and the second terminal of the power switch. The divider divides the voltage difference by a closed resistance of the power switch so as to estimate the current through the CUT.

In some embodiments, the power switch includes a PMOS transistor (P-type Metal Oxide Semiconductor Field Effect Transistor).

In some embodiments, the current meter generates a digital output signal according to the current through the CUT.

In some embodiments, the current meter includes a first ADC (Analog-to-Digital Converter), a second ADC, and a subtractor.

In some embodiments, the first ADC converts a first voltage at the first terminal of the power switch into a first digital signal. The second ADC converts a second voltage at the second terminal of the power switch into a second digital signal. The subtractor subtracts the second digital signal from the first digital signal so as to generate the digital output signal.

In some embodiments, the first ADC includes a first VFC (Voltage-to-Frequency Converter) and a first FDC (Frequency-to-Digital Converter). The second ADC includes a second VFC and a second FDC.

In some embodiments, the first VFC converts the first voltage into a first frequency signal. The first FDC converts the first frequency signal into the first digital signal. The second VFC converts the second voltage into a second frequency signal. The second FDC converts the second frequency signal into the second digital signal.

In another preferred embodiment, the disclosure is directed to a method for monitoring a CUT (Circuit Under Test). The method includes the steps of: providing a power switch and a current meter, wherein the power switch is coupled between a supply voltage and the CUT, and the current meter is coupled in parallel with the power switch; and detecting, via the current meter, a current through the CUT.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are disclosed in detail as follows.

Figure 1:
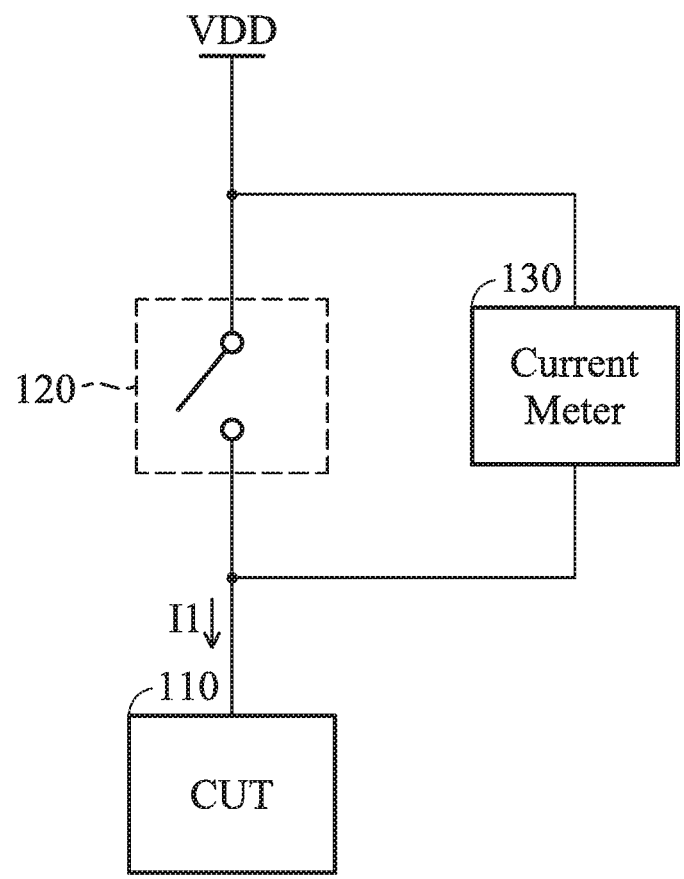
FIG. 1 is a diagram of a monitor circuit according to an embodiment of the invention.

FIG. 1 is a diagram of a monitor circuit 100 according to an embodiment of the invention. The monitor circuit 100 may be applied to integrated circuits in a mobile device, such as a smartphone, a tablet computer, or a notebook computer. The monitor circuit 100 is configured to monitor the real-time power consumption of a CUT (Circuit Under Test) 110. The CUT 110 may be a SOC (System On the Chip), such as a camera module, an encoder module, or a decoder module, but it is not limited thereto. As shown in FIG. 1, the monitor circuit 100 at least includes a power switch 120 and a current meter 130. The power switch 120 is coupled between a supply voltage VDD and the CUT 110. The current meter 130 is coupled in parallel with the power switch 120, and is configured to detect a current I1 flowing through the CUT 110. More specifically, the power switch 120 has a first terminal coupled to the supply voltage VDD, and a second terminal coupled to the CUT 110; and the current meter 130 has a first terminal coupled to the first terminal of the power switch 120, and a second terminal coupled to the second terminal of the power switch 120. The current meter 130 can further generate an output signal relative to the current I1, and other circuits (e.g., a processor) can estimate the power consumption of the CUT 110 by analyzing the output signal from the current meter 130. With such a design, the real-time current and power consumption of the CUT 110 is continuously monitored by the monitor circuit 100, and it helps to solve the problem of integrated circuits overheating during operation.

The detailed structures of the power switch 120 and the current meter 130 will be described in the following embodiments. It should be understood that these embodiments are just exemplary, rather than limitations of the invention.

Figure 2:
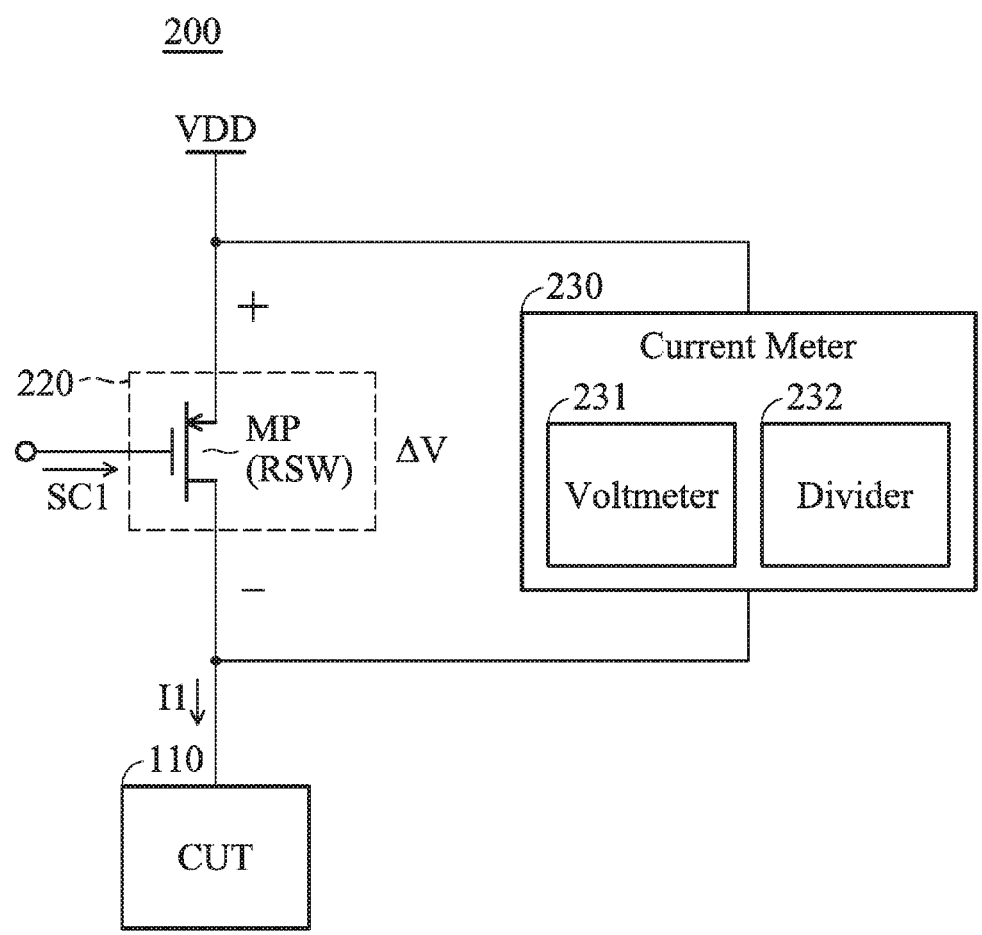
FIG. 2 is a diagram of a monitor circuit according to an embodiment of the invention.

FIG. 2 is a diagram of a monitor circuit 200 according to an embodiment of the invention. The monitor circuit 200 for monitoring a CUT 110 includes a power switch 220 and a current meter 230. FIG. 2 is similar to FIG. 1. In the embodiment of FIG. 2, the power switch 220 includes a PMOS transistor (P-type Metal Oxide Semiconductor Field Effect Transistor) MP which has a control terminal for receiving a control signal SC1, a first terminal coupled to the supply voltage VDD, and a second terminal coupled to the CUT 110. The PMOS transistor MP has a relatively large transistor size (e.g., the gate length may be 24 nm or more), and it is closed or opened according to the control signal SC1. For choosing the size of the PMOS transistor MP, in one embodiment, the condition is that: I1*RSW<0.03*VDD (i.e., the product of I1 and RSW is smaller than the product of 0.03 and VDD). If the PMOS transistor MP is closed, it may have a closed resistance RSW, and if the PMOS transistor MP is opened, it may have an opened resistance which approaches infinity. In other words, the PMOS transistor MP is configured to selectively block or pass a current I1 to the CUT 110. In the embodiment of FIG. 2, the current meter 230 includes a voltmeter 231 and a divider 232. The voltmeter 231 is coupled in parallel with the power switch 220, and is configured to detect a voltage difference ΔV between the first terminal and the second terminal of the power switch 220. Generally, the voltmeter 231 has a very large resistance, and its existence does not affect the current I1 flowing through the CUT 110. That is, the current flowing through the power switch 220 is substantially equal to the current I1 flowing through the CUT 110. The divider 232 is coupled to the voltmeter 231. The current passing through the divider 232 is very small and negligible. When the power switch 220 is closed, the divider 232 is configured to divide the voltage difference ΔV by the closed resistance RSW of the power switch 220, so as to estimate the current I1 flowing through the CUT 110. Specifically, the current I1 can be calculated by the divider 232 of the current meter 230 according to the equation (1).

$$I1 = \frac{\Delta V}{RSW} \quad (1)$$

where "I1" represents the current I1 flowing through the CUT 110 (or the power switch 220), "ΔV" represents the voltage difference ΔV between the first terminal and the second terminal of the power switch 220, and "RSW" represents the closed resistance RSW of the power switch 220.

The divider 232 of the current meter 230 can further generate an output signal relative to the current I1, and other circuits can estimate the power consumption of the CUT 110 by analyzing the output signal from the current meter 230. In some embodiments, the output signal represents a digital binary value (convertible into a decimal value), and it is proportional to the voltage difference ΔV. The current I1 may be calculated by dividing the voltage difference ΔV by the closed resistance RSW. The power consumption may be calculated by multiplying the square of the current I1 by the closed resistance RSW. Other features of the monitor circuit 200 of FIG. 2 are similar to those of the monitor circuit 100 of FIG. 1. Accordingly, the two embodiments can achieve similar levels of performance.

Figure 3:
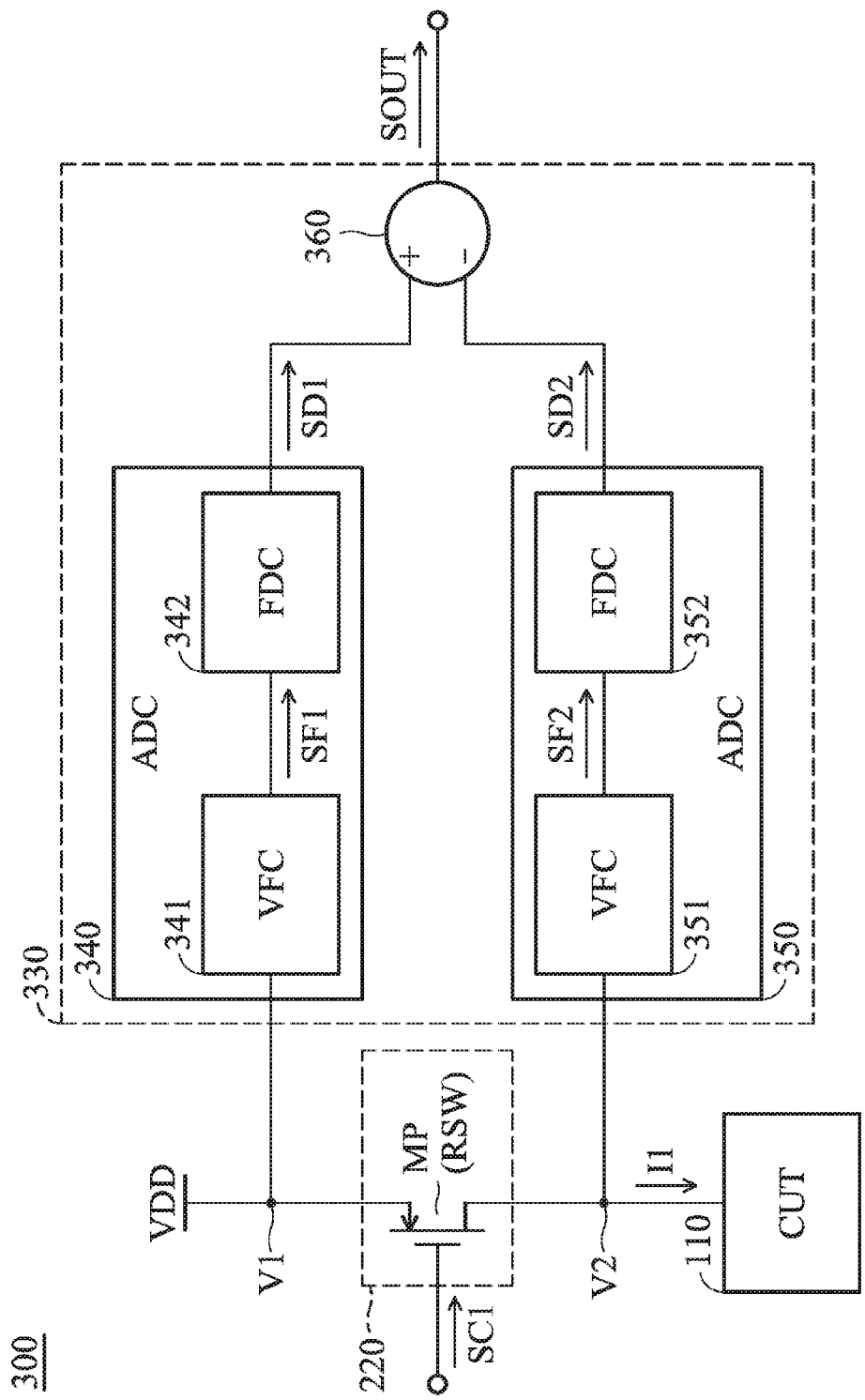
FIG. 3 is a diagram of a monitor circuit according to an embodiment of the invention.

FIG. 3 is a diagram of a monitor circuit 300 according to an embodiment of the invention. The monitor circuit 300 for monitoring a CUT 110 includes a power switch 220 and a current meter 330. FIG. 3 is similar to FIG. 2. In the embodiment of FIG. 3, the power switch 220 includes a PMOS transistor MP, and the current meter 330 includes a first ADC (Analog-to-Digital Converter) 340, a second ADC 350, and a subtractor 360. The current meter 330 is coupled in parallel with the power switch 220. The first ADC 340 is configured to convert a first voltage V1 at a first terminal of the power switch 220 into a first digital signal SD1. The second ADC 350 is configured to convert a second voltage V2 at a second terminal of the power switch 220 into a second digital signal SD2. The subtractor 360 is configured to subtract the second digital signal SD2 from the first digital signal SD1, so as to generate a digital output signal SOUT (i.e., SOUT=SD1−SD2). As mentioned in the embodiment of FIG. 2, the current I1 flowing through CUT 110 can be calculated by dividing the voltage difference ΔV (i.e., ΔV=V1−V2) by the closed resistance RSW. The current I1 flowing through CUT 110 should be proportional to the voltage difference ΔV between the first terminal and the second terminal of the power switch 220 because the closed resistance RSW is generally considered as a constant value. The subtractor 360 of the current meter 330 can generate the digital output signal SOUT relative to the voltage difference ΔV, and other circuits can estimate the current and power consumption of the CUT 110 by analyzing the digital output signal SOUT from the current meter 330. Other features of the monitor circuit 300 of FIG. 3 are similar to those of the monitor circuit 200 of FIG. 2. Accordingly, the two embodiments can achieve similar levels of performance.

In some embodiments, the first ADC 340 includes a first VFC (Voltage-to-Frequency Converter) 341 and a first FDC (Frequency-to-Digital Converter) 342, and the second ADC 350 includes a second VFC 351 and a second FDC 352. For example, the first VFC 341 and the second VFC 351 may be VCOs (Voltage-Controlled Oscillators) for outputting adjustable frequency signals in response to input voltages, and the first FDC 342 and the second FDC 352 may be frequency counters for counting frequency signals during a specific period of time, but they are not limited thereto. The first VFC 341 is configured to convert the first voltage V1 at the first terminal of the power switch 220 into a first frequency signal SF1, which is an analog signal. The first FDC 342 is configured to convert the first frequency signal SF1 into the first digital signal SD1. The second VFC 351 is configured to convert the second voltage V2 at the second terminal of the power switch 220 into a second frequency signal SF2, which is another analog signal. The second FDC 352 is configured to convert the second frequency signal SF2 into the second digital signal SD2. Similarly, the subtractor 360 is configured to subtract the second digital signal SD2 from the first digital signal SD1 so as to generate the digital output signal SOUT.

Figure 4:
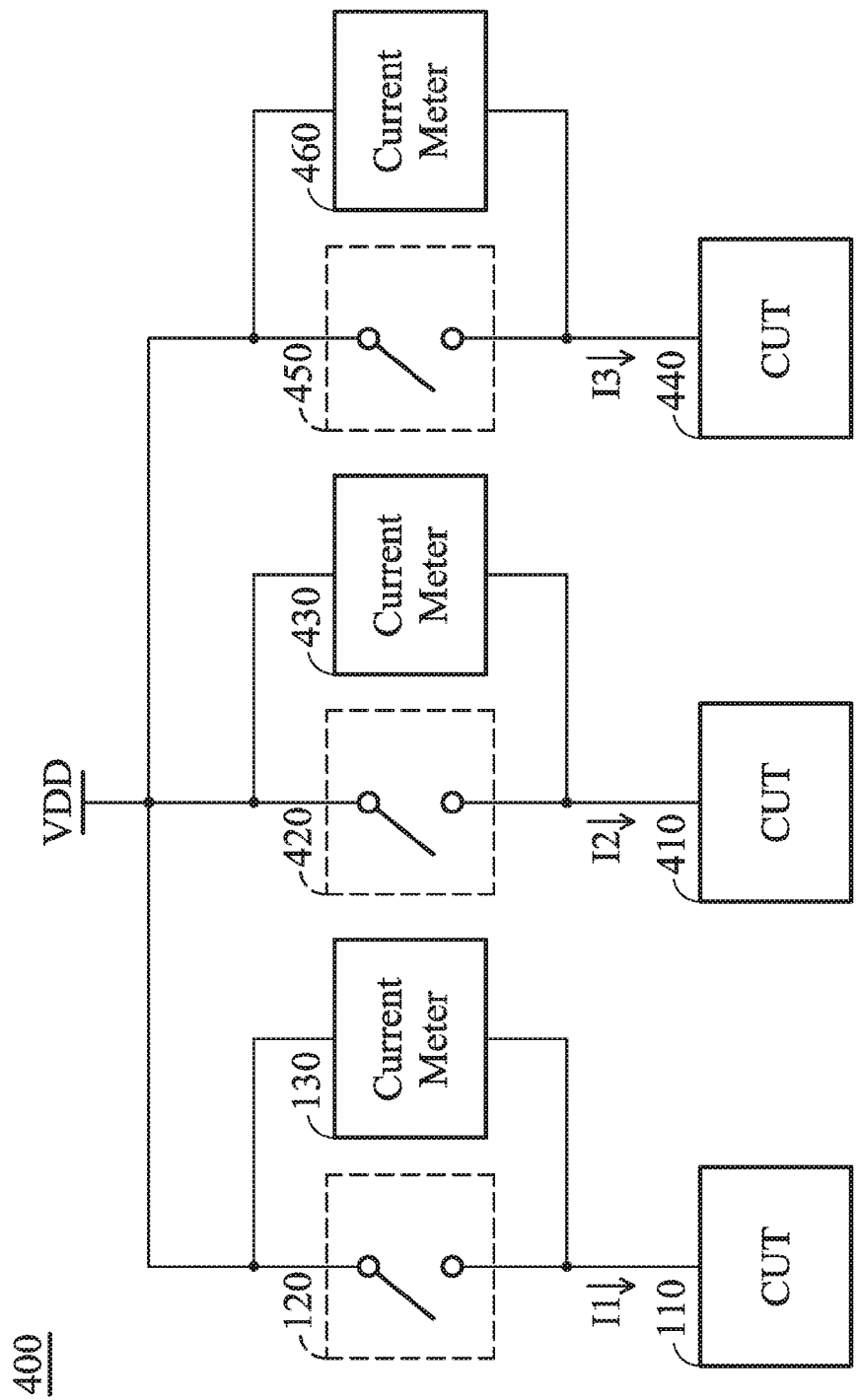
FIG. 4 is a diagram of a monitor circuit according to an embodiment of the invention.

FIG. 4 is a diagram of a monitor circuit 400 according to an embodiment of the invention. The monitor circuit 400 for monitoring multiple CUTs 110, 410, and 440 includes multiple power switches 120, 420, and 450, and multiple current meters 130, 430, and 460. FIG. 4 is similar to FIG. 1. In the embodiment of FIG. 4, each of the power switches 120, 420, and 450 is coupled between the supply voltage VDD and a respective one of the CUTs 110, 410, and 440.

Furthermore, each of the current meters 130, 430, and 460 is coupled in parallel with a respective one of the power switches 120, 420, and 450. That is, the monitor circuit 400 may include multiple power switches and multiple current meters for monitoring the currents through multiple CUTs, respectively. Therefore, the power consumption of the respective CUTs can be estimated. It should be understood that the monitor circuit 400 may include more power switches and more current meters although there are just three power switches and three current meters displayed in FIG. 4. Other features of the monitor circuit 400 of FIG. 4 are similar to those of the monitor circuit 100 of FIG. 1. Accordingly, the two embodiments can achieve similar levels of performance.

Figure 5:
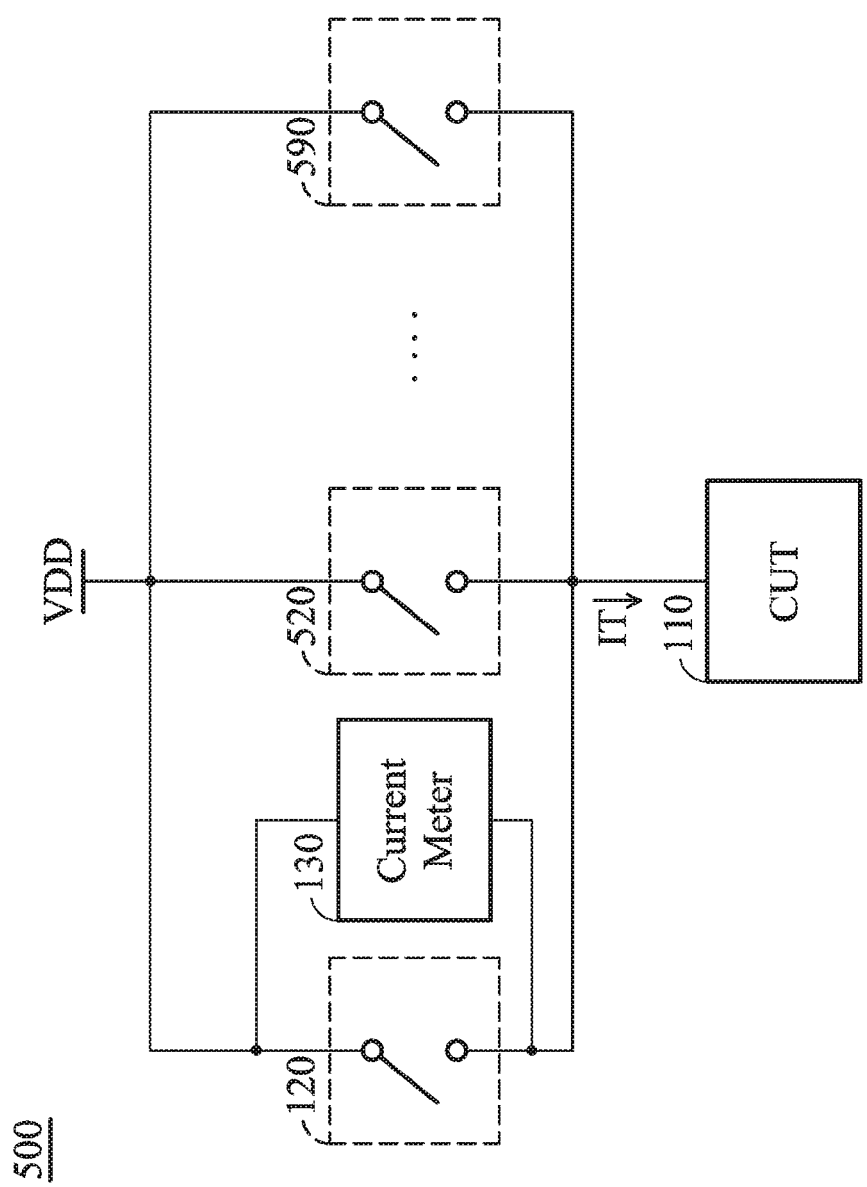
FIG. 5 is a diagram of a monitor circuit according to an embodiment of the invention.

FIG. 5 is a diagram of a monitor circuit 500 according to an embodiment of the invention. The monitor circuit 500 for monitoring a CUT 110 includes multiple power switches 120, 520, . . . , and 590, and a current meter 130. FIG. 5 is similar to FIG. 1. In the embodiment of FIG. 5, the power switches 120, 520, . . . , and 590 are all coupled between the supply voltage VDD and the CUT 110. Furthermore, the current meter 130 is coupled in parallel with one power switch 120. That is, the monitor circuit 500 can merely monitor the current flowing through the power switch 120, regardless of the other currents flowing through the other power switches 520, . . . , and 590. In general manufacturing processes, the power switches 120, 520, . . . , and 590 have similar transistor sizes and closed-resistances. It is appropriate to assume that the power switches 120, 520, . . . , and 590 conduct the same currents when they are closed. As a result, the total current IT flowing through the CUT 110 can be estimated by simply multiplying the current through the power switch 120 by the total number of the power switches 120, 520, . . . , and 590. It should be understood that the monitor circuit 500 may include more power switches and more current meters although there are just three power switches and one current meter displayed in FIG. 5. Other features of the monitor circuit 500 of FIG. 5 are similar to those of the monitor circuit 100 of FIG. 1. Accordingly, the two embodiments can achieve similar levels of performance.

Figure 6:
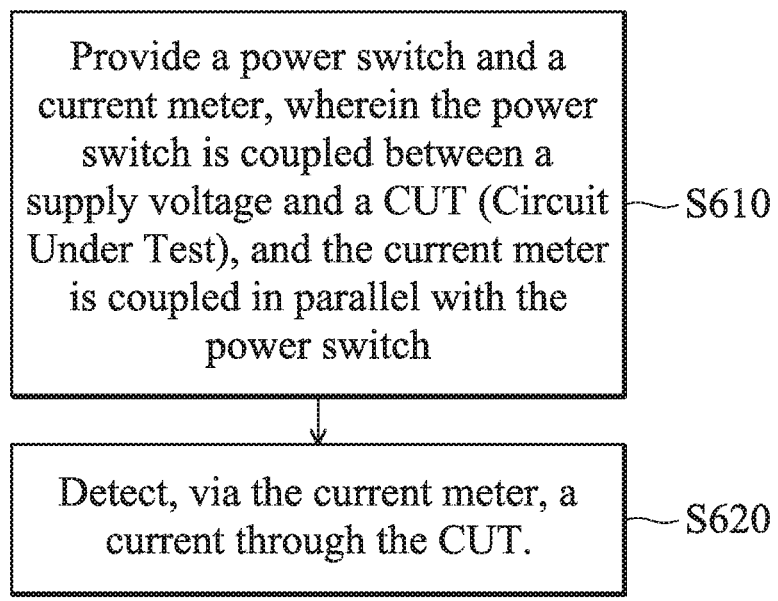
FIG. 6 is a flowchart of a method for monitoring a CUT (Circuit Under Test) according to an embodiment of the invention.

FIG. 6 is a flowchart of a method for monitoring a CUT according to an embodiment of the invention. The method includes at least the following steps. In step S610, a power switch and a current meter are provided. The power switch is coupled between a supply voltage and the CUT. The current meter is coupled in parallel with the power switch. In step S620, a current through the CUT is detected via the current meter. It should be understood that every feature of the embodiments of FIGS. 1-5 may be applied to the method of FIG. 6.

The invention proposes a novel monitor circuit for monitoring the power consumption of each CUT (e.g., SOC) in an integrated circuit. In the proposed monitor circuit, at least one current meter is coupled in parallel with one or more power switches, and therefore the current through the corresponding CUT and the power consumption thereof can be estimated. In some cases, if there are too many power switches in the integrated circuit, the proposed monitor circuit can sample the current through at least one power switch, and estimate the total current and total power consumption according to simple multiplication law. Based on the practical measurements, the closed-resistances of the power switches are almost the same over a variety of manufacturing processes. For example, even if different manufacturing processes of semiconductors are used, the power switches, like PMOS transistors, can have almost constant closed-resistances of about 0.4Ω. In other words, the sampling and multiplication method used by the proposed monitor circuit does not affect the accuracy of estimation of power consumption so much. Such a simplified method can be applied to a design of large circuits, and it can significantly reduce the manufacturing cost of current meters.

The above voltages, currents, and resistances are just exemplary, rather than limitations of the invention. One of ordinary skill may adjust these settings according to different requirements. It should be understood that the proposed monitor circuit and method are not limited to the configurations of FIGS. 1 to 6. The invention may merely include any one or more features of any one or more embodiments of FIGS. 1 to 6. In other words, not all of the features shown in the figures should be implemented in the proposed monitor circuit and method of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A monitor circuit for monitoring a CUT (Circuit Under Test), comprising:
   a power switch, coupled between a supply voltage and the CUT; and
   a current meter, coupled in parallel with the power switch, and detecting a current through the CUT;
   wherein the current meter comprises a first ADC (Analog-to-Digital Converter), a second ADC, and a subtractor;
   wherein the first ADC comprises a first VFC (Voltage-to-Frequency Converter) and a first FDC (Frequency-to-Digital Converter), and the second ADC comprises a second VFC and a second FDC.

2. The monitor circuit as claimed in claim 1, wherein the power switch comprises a PMOS transistor (P-type Metal Oxide Semiconductor Field Effect Transistor).

3. The monitor circuit as claimed in claim 1, wherein the current meter generates a digital output signal according to the current through the CUT.

4. The monitor circuit as claimed in claim 3, wherein the first ADC converts a first voltage at a first terminal of the power switch into a first digital signal, the second ADC converts a second voltage at a second terminal of the power switch into a second digital signal, and the subtractor subtracts the second digital signal from the first digital signal so as to generate the digital output signal.

5. A method for monitoring a CUT (Circuit Under Test), comprising the steps of:
   providing a power switch and a current meter, wherein the power switch is coupled between a supply voltage and the CUT, and the current meter is coupled in parallel with the power switch; and
   detecting, via the current meter, a current through the CUT;

wherein the current meter comprises a first ADC (Analog-to-Digital Converter), a second ADC, and a subtractor;
wherein the first ADC comprises a first VFC (Voltage-to-Frequency Converter) and a first FDC (Frequency-to-Digital Converter), and the second ADC comprises a second VFC and a second FDC.

6. The method as claimed in claim 5, wherein the power switch comprises a PMOS transistor (P-type Metal Oxide Semiconductor Field Effect Transistor).

7. The method as claimed in claim 5, further comprising:
generating, via the current meter, a digital output signal according to the current through the CUT.

8. The method as claimed in claim 7, further comprising:
converting, via the first ADC, a first voltage at a first terminal of the power switch into a first digital signal;
converting, via the second ADC, a second voltage at a second terminal of the power switch into a second digital signal; and
subtracting, via the subtractor, the second digital signal from the first digital signal so as to generate the digital output signal.

* * * * *